US008886481B1

(12) United States Patent
Rahman et al.

(10) Patent No.: US 8,886,481 B1
(45) Date of Patent: Nov. 11, 2014

(54) REDUCING VARIATION IN MULTI-DIE INTEGRATED CIRCUITS

(75) Inventors: Arifur Rahman, San Jose, CA (US);
Michael J. Hart, Palo Alto, CA (US);
Venkatesan Murali, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 688 days.

(21) Appl. No.: 12/835,184

(22) Filed: Jul. 13, 2010

(51) Int. Cl.
*G06F 19/00* (2011.01)

(52) U.S. Cl.
USPC .......................................... 702/84

(58) Field of Classification Search
USPC .......................................... 702/84
See application file for complete search history.

(56) References Cited

PUBLICATIONS

Michael Kadin and Sherief Reda, Division of Engineering, Brown University, Frequency and Voltage Planning for Multi-Core Processors Under Thermal Constraints, p. 463-470, 2008 IEEE.*
Webopedia, Quad-core technology, p. 1, printed on Sep. 12, 2012 on 2006 technology.*
Rakesh Kumar, Single-ISA Heterogeneous Multi-Core Architectures: The Potential for Processor Power Reduction, In Proceedings of the 36th International Symposium on Microarchitecture, Dec. 2003, 12 pages.*

* cited by examiner

*Primary Examiner* — Tung S Lau
(74) *Attorney, Agent, or Firm* — Kevin T. Cuenot; Lois D. Cartier (57) ABSTRACT

A method of reducing variation in multi-die integrated circuits can include, for each of a plurality of dies, determining at least one performance metric and selecting at least two dies for inclusion within a multi-die integrated circuit according to the at least one performance metric. Systems and devices for executing the steps of the method are also described.

19 Claims, 7 Drawing Sheets

REDUCING VARIATION IN MULTI-DIE INTEGRATED CIRCUITS

FIELD OF THE INVENTION

One or more embodiments disclosed within this specification relate to integrated circuits (ICs). More particularly, one or more embodiments relate to reducing variation in ICs that include multiple dies.

BACKGROUND

Programmable integrated circuits (ICs) are a well-known type of integrated circuit that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry and the programmable logic circuitry, are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

In general, the probability that a manufacturing flaw or "fault" will occur within an IC increases as the size of the die used to implement that IC increases. The occurrence of a manufacturing fault within an IC can result in a reduction, or a complete failure, in the operability of the IC. For this reason, it can be more cost effective to implement an IC in the form of a multi-die IC as opposed to a single, monolithic die. A multi-die IC, in general, is formed using a plurality of dies coupled together and disposed within a single package. A manufacturing fault occurring within any one of the dies of a multi-die IC renders only that die inoperable. Thus, within a multi-die IC, a manufacturing fault renders less die area unusable than when a fault occurs within an IC formed of a single, larger die.

SUMMARY

One or more embodiments disclosed within this specification relate to integrated circuits (ICs) and, more particularly, to reducing variation in ICs that include multiple dies. One embodiment can include a method of reducing variation in multi-die ICs. The method can include, for each of a plurality of dies, determining at least one performance metric and selecting, via a processor, at least two dies for inclusion within a multi-die IC according to the at least one performance metric. For example, the performance metric can be selected to be or include static power dissipation and/or operating frequency.

The method can include sorting each of the plurality of dies into one of a plurality of die groups according to the at least one performance metric of each die. Accordingly, selecting at least two dies can include selecting at least two dies from at least one of the plurality of die groups.

In one aspect, selecting at least two dies can include selecting only dies for inclusion within the multi-die IC from a same die group. In another aspect, selecting at least two dies can include selecting a first die from a first die group of the plurality of die groups and at least a second die from at least a second die group of the plurality of die groups for inclusion within the multi-die IC. For example, the at least a second die group can be selected to be a die group including dies with a performance metric superior to the dies of the first die group.

In still another aspect, selecting at least two dies can include selecting the at least two dies according to a measure of correlation between the at least one performance metric of each die.

The method also can include, for each of a plurality of interposers, determining at least one performance metric and selecting an interposer according to the at least one performance metric of the interposer for inclusion within the multi-die IC with the selected dies.

Another embodiment can include a system for reducing variation in multi-die ICs. The system can include a memory storing program code and a processor coupled to the memory. Responsive to executing the program code, the processor can be configured to perform steps including, for each of a plurality of dies, determining at least one performance metric and selecting at least two dies for inclusion within a multi-die IC according to the at least one performance metric.

The processor can be configured to sort each of the plurality of dies into one of a plurality of die groups according to the at least one performance metric of each die. In that case, selecting at least two dies can include selecting at least two dies from at least one of the plurality of die groups.

In one aspect, selecting at least two dies can include selecting only dies for inclusion within the multi-die IC from a same die group. In another aspect, selecting at least two dies can include selecting a first die from a first die group of the plurality of die groups and at least a second die from at least a second die group of the plurality of die groups for inclusion within the multi-die IC. In still another aspect, selecting at least two dies can include selecting the at least two dies according to a measure of correlation between the at least one performance metric of each die.

The processor further can be configured to perform steps including, for each of a plurality of interposers, determining at least one performance metric and selecting an interposer according to the at least one performance metric of the interposer for inclusion within the multi-die IC with the selected dies.

Another embodiment can include a device including a non-transitory data storage medium usable by a system having a processor and a memory. The non-transitory data storage medium can store program code that, when executed by the system, configures the system to perform a method of reducing variation in multi-die ICs. The method can include, for each of a plurality of dies, determining at least one performance metric and selecting at least two dies for inclusion within a multi-die IC according to the at least one performance metric.

The non-transitory data storage medium can store further program code that, when executed by the system, configures the system to perform a step including sorting each of the plurality of dies into one of a plurality of die groups according to the at least one performance metric of each die, wherein selecting at least two dies further comprises selecting at least two dies from at least one of the plurality of die groups.

In one aspect, selecting at least two dies can include selecting only dies for inclusion within the multi-die IC from a same die group. In another aspect, selecting at least two dies can include selecting a first die from a first die group of the plurality of die groups and at least a second die from at least a second die group of the plurality of die groups for inclusion within the multi-die IC.

The non-transitory data storage medium can store further program code that, when executed by the system, configures the system to perform steps including, for each of a plurality of interposers, determining at least one performance metric and selecting an interposer according to the at least one performance metric of the interposer for inclusion within the multi-die IC with the selected dies.

DETAILED DESCRIPTION

While the specification concludes with claims defining the features of one or more embodiments of the invention that are regarded as novel, it is believed that the one or more embodiments of the invention will be better understood from a consideration of the description in conjunction with the drawings. As required, one or more detailed embodiments of the present invention are disclosed herein; however, it is to be understood that the disclosed embodiment(s) are merely exemplary of the inventive arrangements, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of one or more embodiments of the invention.

One or more embodiments disclosed within this specification relate to integrated circuits (ICs) and, more particularly, to reducing variation in ICs that include multiple dies. In accordance with one or more embodiments disclosed within this specification, dies to be used to implement a multi-die IC can be characterized in terms of one or more performance metrics. The dies can be sorted, or classified, into various die groups based upon the performance metrics. For example, dies having like characterizations with respect to one or more selected performance metrics can be assigned or placed into a same die group.

Dies can be selected for implementing the multi-die IC from one or more die groups. The particular die groups from which dies are selected can be chosen so that when combined to create the multi-die IC, the dies, when viewed collectively in reference to the multi-die IC as a whole, meet the performance specification. For example, by using only dies from a selected die group or die groups, the multi-die IC, as a whole, is more likely to meet the performance specification since the inclusion of dies with reduced or substandard performance metrics can be excluded from consideration. Thus, situations in which inclusion of a die with substandard performance metrics degrades the overall performance of the multi-die IC can be avoided.

Figure 1:
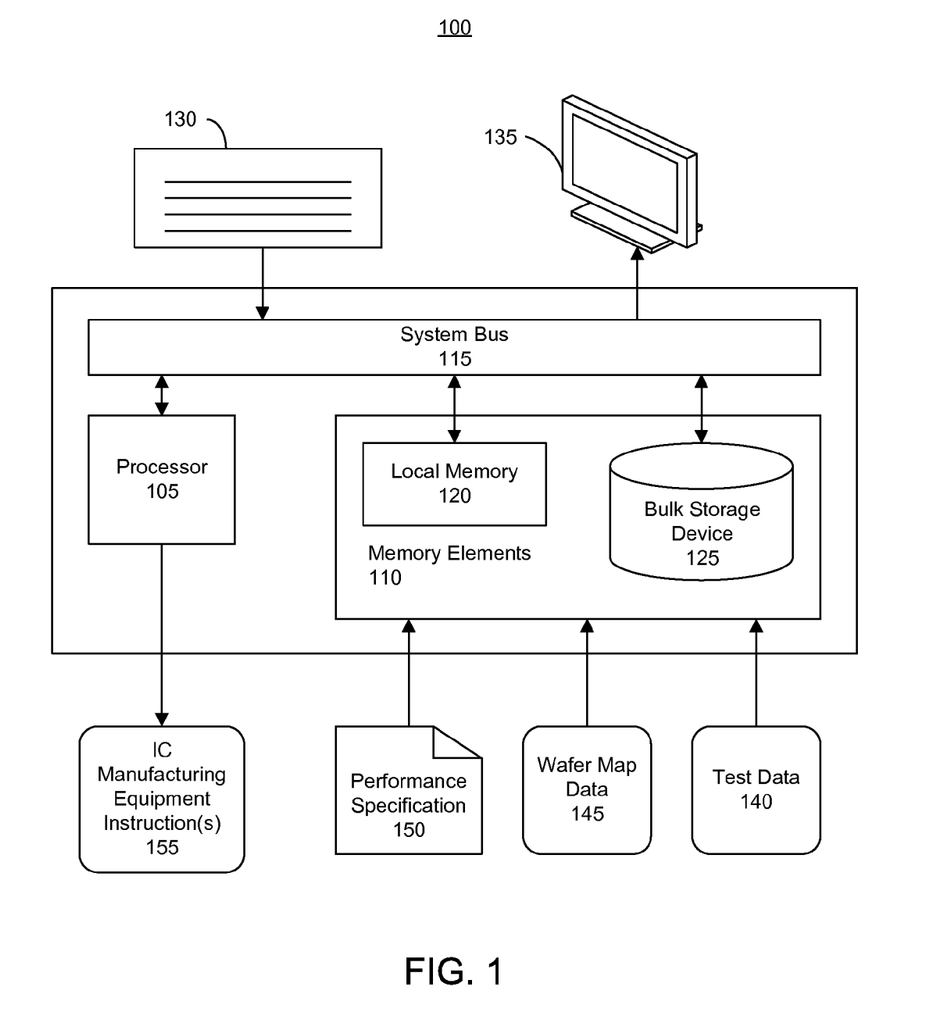
FIG. 1 is a first block diagram illustrating a system for reducing variation in multi-die IC.

FIG. 1 is a first block diagram illustrating a system 100 for reducing variation in multi-die ICs in accordance with one embodiment. As shown, system 100 can include at least one processor 105 coupled to memory elements 110 through a system bus 115. As such, system 100 can store program code within memory elements 110. Processor 105 can execute the program code accessed from memory elements 110 via system bus 115. In one aspect, for example, system 100 can be implemented as a computer that is suitable for storing and/or executing program code. It should be appreciated, however, that system 100 can be implemented in the form of any system comprising a processor and memory that is capable of performing the functions described within this specification.

Memory elements 110 can include one or more physical memory devices such as, for example, local memory 120 and one or more bulk storage devices 125. Local memory 120 refers to random access memory or other non-persistent memory device(s) generally used during actual execution of the program code. Bulk storage device(s) 125 can be implemented as a hard drive or other persistent data storage device.

System 100 also can include one or more cache memories (not shown) that provide temporary storage of at least some program code in order to reduce the number of times program code must be retrieved from bulk storage device 125 during execution.

Input/output (I/O) devices such as a keyboard 130, a display 135, and a pointing device (not shown) optionally can be coupled to system 100. The I/O devices can be coupled to system 100 either directly or through intervening I/O controllers. Network adapters also can be coupled to system 100 to enable system 100 to become coupled to other systems, computer systems, remote printers, and/or remote storage devices through intervening private or public networks. Modems, cable modems, and Ethernet cards are examples of different types of network adapters that can be used with system 100.

As pictured in FIG. 1, system 100 can receive different types of data including, but not limited to, test data 140, wafer map data 145, and a performance specification 150 for one or more multi-die ICs to be manufactured. Die test data 140 can specify test results collected from subjecting the plurality of dies manufactured for use in implementing the multi-die ICs to a variety of different tests. The dies can be tested for speed, e.g., maximum operating frequency, and power consumption, e.g., static power dissipation. Accordingly, the test data can include, but is not limited to, timing analysis data, power consumption data, and the like, for a range or variety of different operating conditions. The timing analysis data, for example, can specify the maximum operating speed of each die in terms of operating frequency. The power consumption data, for example, can specify the maximum static power dissipation of each die.

In one or more embodiments, the dies can be tested while still in wafer form, e.g., prior to dicing. In general, "dicing" refers to the process of physically separating the dies of a wafer from one another into individual IC chips. Accordingly, system 100 can receive wafer map data 145. Wafer map data 145 can include one or more wafer maps that specify, for each die, the particular wafer within which the die is located and the location of the die within the enumerated wafer. Thus, test data 140 can be correlated with specific ones of the physical dies by cross-referencing test data 140 with wafer map data 145.

System 100 further can receive performance specification 150. Performance specification 150 can specify one or more performance metrics to be met by the multi-die IC(s) to be manufactured. For example, performance specification 150 can specify a power metric in the form of a maximum static power dissipation value or a range for static power dissipation for the multi-die IC. Performance specification 150 can specify a speed metric in the form of a minimum operating frequency or an operating frequency range for the multi-die IC. It should be appreciated that different users may have different requirements for a multi-die IC. In this regard, one performance specification 150 can require low static power dissipation, but have less stringent requirements in terms of operational frequency. Another performance specification can require a high operational frequency, but be less stringent in terms of static power dissipation.

System 100 can receive and store test data 140, wafer map data 145, and performance specification 150 within memory elements 110. System 100 can include operational software that processes test data 140, wafer map data 145, and performance specification 150. In general, based upon the aforementioned data, system 100 can select particular dies to be used in making one or more multi-die ICs that meet performance specification 150. Accordingly, system 100 can output one or more IC manufacturing equipment instructions 155 that instruct the IC manufacturing equipment to select, or pick, the selected dies to be formed into the multi-die IC(s) in accordance with performance specification 150.

Figure 2A:
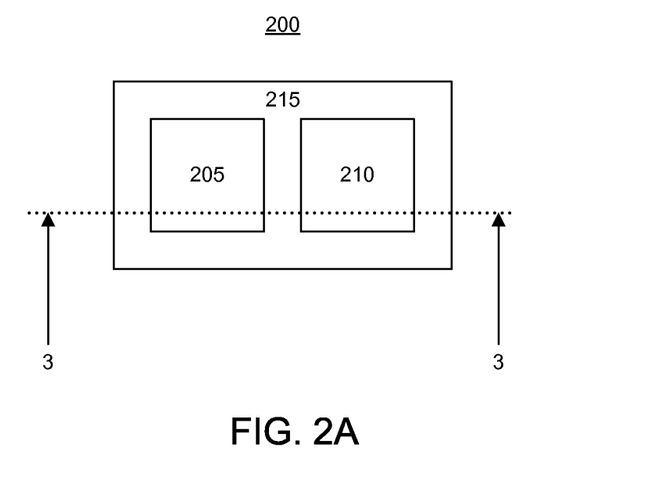
FIG. 2A is a second block diagram illustrating a first exemplary multi-die IC.

FIG. 2A is a second block diagram illustrating a first multi-die IC 200 in accordance with another embodiment. As shown, multi-die IC 200 includes two dies 205 and 210 disposed atop of an interposer 215. Each of dies 205 and 210 can implement any of a variety of different types of circuits or chips. For example, each of dies 205 and 210 can be implemented as a memory, a processor, or a programmable IC. In another example, die 205 can implement a memory and die 210 can implement a processor or a programmable IC. In still another example, one or both of dies 205 and 210 can implement application specific integrated circuits or a mixed signal chip. The examples presented are for purposes of illustration and are not intended to limit the one or more embodiments disclosed within this specification.

Interposer 215 can communicatively link die 205 and die 210 by coupling selected pads of die 205 with selected pads of die 210. The connections created through interposer 215 can be referred to as inter-die connections, signals, or wires, as the case may be. For purposes of illustration, only two dies are shown. The one or more embodiments described within this specification, however, are not intended to be limited by the number of dies disposed upon interposer 215. For example, three or more dies can be disposed atop of interposer 215.

Figure 2B:
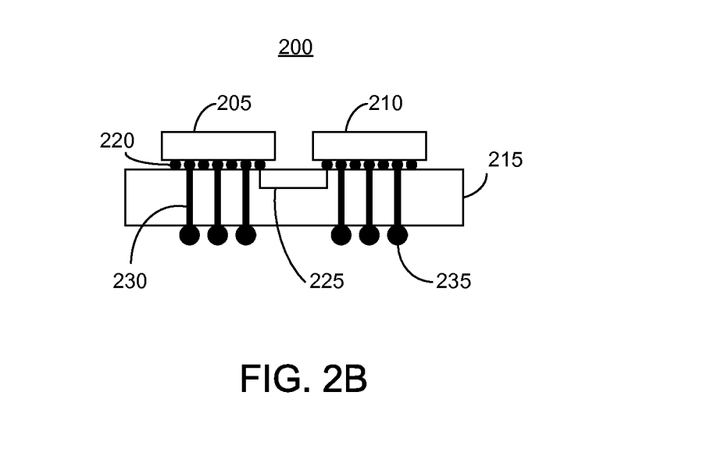
FIG. 2B is a cross-sectional side view of the first exemplary multi-die IC.

FIG. 2B is a cross-sectional side view of the first multi-die IC 200 in accordance with another embodiment. FIG. 2B illustrates multi-die IC 200 taken along cutline 3 in FIG. 2A. Interposer 215 can be implemented as a die formed of one or more layers of an IC manufacturing process. Interposer 215 can include at least one metallization layer, but can include a plurality of metallization layers separated by appropriate insulating or non-conductive layers. The metallization layer, or layers as the case may be, implements inter-die wires 225 that couple selected pads of die 205 to selected pads of die 210.

In one or more embodiments, interposer 215 can be configured as an entirely passive structure within which inter-die wires 225 are implemented. In one or more other embodiments, interposer 215 can include one or more active devices and, thus, be considered an active structure. The one or more embodiments described within this specification are not intended to be limited to either passive or active interposers.

Die 205 and die 210 can be coupled to interposer 215 through a plurality of micro bumps 220. Micro bumps 220 generally are solder balls that electrically couple pads (not shown) of each of dies 205 and 210 to pads (not shown) of interposer 215. The pads of interposer 215 coupled to micro bumps 220 can couple to inter-die wires 225 or through silicon vias (TSVs) 230. Inter-die wires 225 are effectively long interconnect lines within interposer 215 that couple different dies. For example, inter-die wires 225 can couple one or more pads of die 205 with one or more pads of die 210. As shown, inter-die wires 225 can be disposed beneath a top surface, e.g., within, interposer 215.

Each TSV 230 can extend completely through interposer 215, extending from a pad disposed immediately below a top surface of interposer 215 through to a pad exposed through the bottom surface of interposer 215. Each TSV 230 can couple a pad of one of dies 205 or 210, via a micro bump 220, for example, to one of the plurality of package bumps 235. Package bumps 235, also referred to as "C4 bumps," generally are solder balls that couple to pads on the bottom portion of interposer 215 to the package of multi-die IC 200, and thus, to external pins of the package. One or more pads of die 205 and one or more pads of die 210 can be coupled to external pins of the package of multi-die IC 200 by coupling such pads to micro bumps 220, to TSVs 230, to package bumps 235, and to external package pins.

Die 205, die 210, and interposer 215 can be manufactured separately, e.g., each as part of its own distinct wafer. Thus, die 205, die 210, and interposer 215 can be tested while still in wafer form, e.g., prior to dicing and prior to bonding die 205 and die 210 atop of interposer 215. Testing while still in wafer form ensures that known bad dies are not used in implementing multi-die IC 200.

FIGS. 2A and 2B illustrate a multi-die IC in which the dies are horizontally disposed. However, it should be understood that the dies can be vertically stacked, instead of or in addition to the horizontal disposition, e.g., as shown in FIGS. 3A and 3B.

Figure 3A:
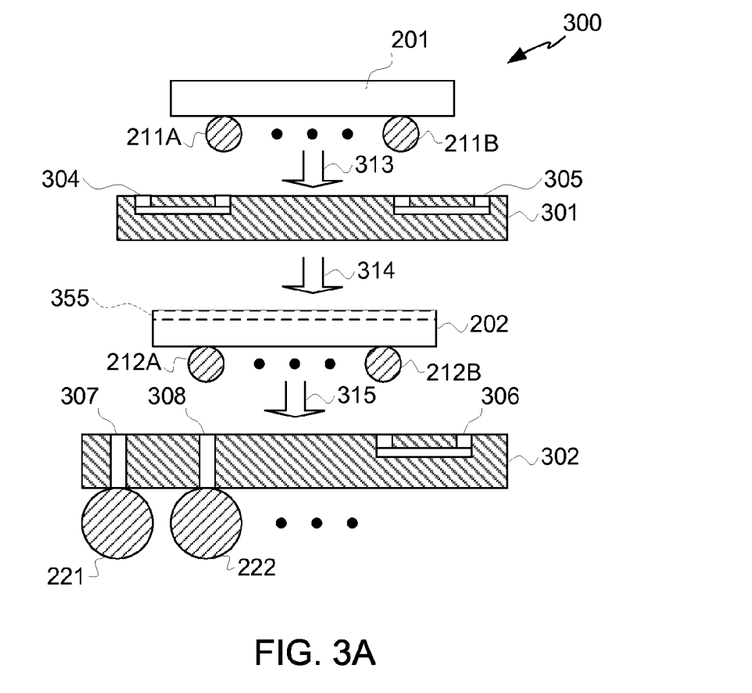
FIG. 3A is a cross-sectional view illustrating a second exemplary multi-die IC.
Figure 3B:
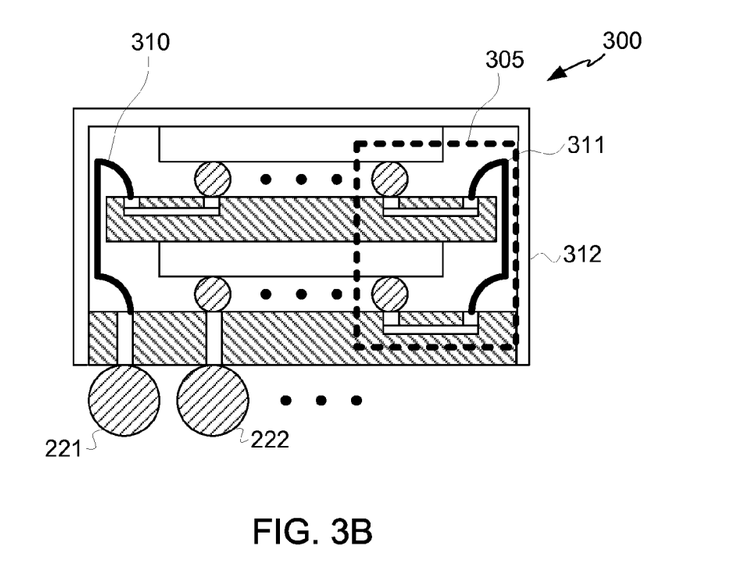
FIG. 3B is the cross-sectional view of FIG. 3A after assembling and packaging of the multi-die IC of FIG. 3A.

FIG. 3A is a cross-sectional view depicting a second multi-die IC 300. Multi-die IC 300 includes die 201, die 202, substrate 301, and substrate 302. In this exemplary embodiment, substrate 301, which is sometimes referred to as an interposer, is located between die 201 and die 202. In this embodiment, the interposer 301 is a passive interposer; however, interposer 301 may optionally be an active interposer, namely with one or more transistors formed using interposer 301 as a substrate for such transistor formation. Thus, optionally, a die-to-die coupling may be for a die-to-die vertical stacking, where an interposer 301 is effectively built into or directly attached, namely "integral," to a substrate of a die, such as generally indicated by optional block 355 of die 202, for more direct interconnect of die-to-die contacts. In such an option, through-hole vias (not shown) in die 202 may be used for forming interconnects. However, for purposes of clarity, it shall be assumed that a non-integral or separate one or more conductive layer laminate substrate is used for interposer 301.

Substrate 301 includes conductive lines 304 and 305. Substrate 302 includes conductive lines 306 through 308. Conductive lines 307 and 308 extend generally vertically through substrate 302 respectively to provide contacts to balls 221 and 222.

As generally indicated by arrow 313, die 201 is attached to substrate 301. As generally indicated by arrow 314, substrate 301 is disposed above and may be attached to or put in contact with die 302. A paste, not shown, may be used in some embodiments for attaching substrate 301 to die 202. Arrow 315 generally indicates that die 202 is attached to substrate 302.

FIG. 3B is the cross-sectional view of FIG. 3A after assembling and packaging of multi-die IC 300. In the exemplary embodiment of multi-die IC 300, a vertical chip-stacked package IC is illustratively depicted. A cover 312 may be used for environmental protection of die 201, die 202, interposer 301, and in part substrate 302, as well as wire bonds 310 and 311 and balls 211 and 212. With simultaneous reference to FIGS. 3A and 3B, multi-die IC 300 is further described.

Wire bond 310 may be used to interconnect conductive line 304 to conductive line 307. Wire bond 311 may be used to interconnect conductive line 305 to conductive line 306. Conductive line 307 is connected to ball 221. Ball 212A is coupled to ball 222 via conductive line 308. Ball 211A is connected to line 304. Ball 211B is connected to line 305. Wire bond 311 is used to interconnect conductive line 305 to conductive line 306. Ball 212B is connected to conductive line 306. Thus, it should be understood that an interior node 305 of multi-die IC 300 is formed by balls 211B and 212B, conductive lines 305 and 306, and wire bond 311. Moreover, ball 211A is coupled to ball 211 via conductive line 304, wire bond 310, and conductive line 307.

Figure 4:
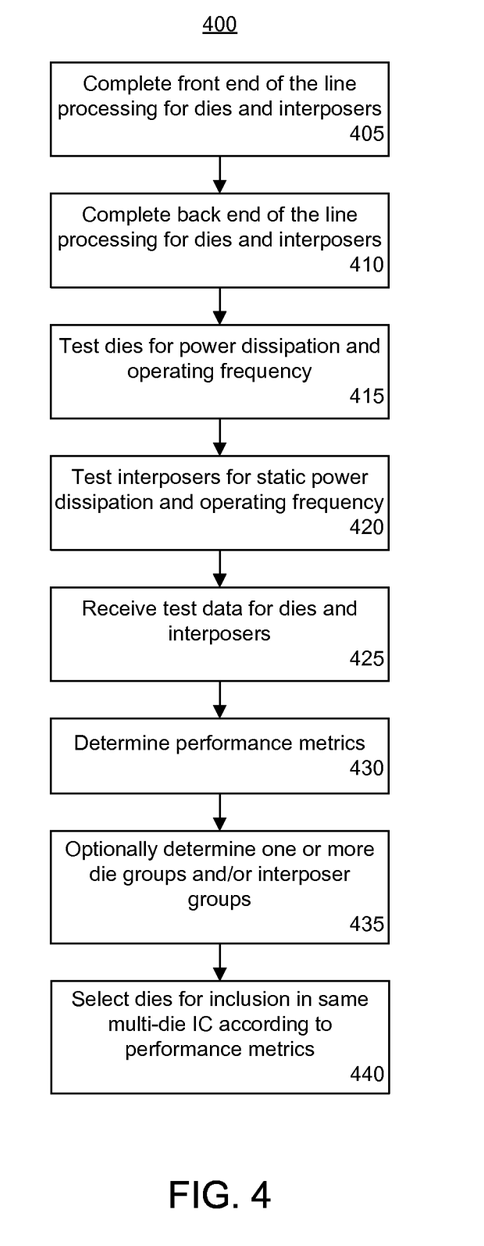
FIG. 4 is a first flow chart illustrating a method of reducing variation in a multi-die IC.

FIG. 4 is a flow chart illustrating a method 400 of reducing variation in a multi-die IC in accordance with another embodiment. Method 400 can be performed by a system such as system 100 described with reference to FIG. 1. Method 400 can begin in a state where dies for a multi-die IC manufacturing process are being fabricated in addition to the interposer upon which the dies are to be disposed or bonded. The manufacturing process can be implemented to create or manufacture a multi-die IC as illustrated with reference to FIGS. 2 and 3, for example. The dies and the interposers can be in wafer form, for example. It should be appreciated that while method 400 is described with reference to building a single multi-die IC, the process can be performed to build a plurality of multi-die ICs.

In step 405, front end of the line (FEOL) processing for the dies and the interposers can be completed. In general, FEOL refers to the beginning processes of IC fabrication. FEOL generally includes processes that form individual devices such as transistors, resistors, and the like that are patterned upon the semiconductor material. For example, FEOL processing can refer to all processes performed during IC manufacturing up to, but not including, the deposition of metal layers.

In step 410, back end of the line (BEOL) processing for the dies and the interposers can be performed. In general, BEOL processing refers to IC fabrication processes where devices, e.g., transistors and the like, are interconnected with wiring or metal on the wafer. BEOL processing generally begins where FEOL leaves off and, thus, can start with the deposition of the first metal layer on the wafer. BEOL processes can include formation of contacts, insulators, metal layers, and bonding sites for die-to-package and die-to-die connections. While dicing can be considered a BEOL process, in one or more embodiments, step 410 can be performed up to, but not including, dicing.

In step 415, the dies can be tested. The dies can be tested for static power dissipation and for operating frequency. Dies can be tested under different operating conditions to measure power and speed. For example, a test circuit, such as a ring oscillator, can be instantiated, as in the case of a programmable IC type of die, or otherwise formed within each die. The performance of that circuit in terms of speed, e.g., maximum operating frequency, and power, e.g., maximum static power dissipation, can be observed or monitored.

In one or more other embodiments, multiple test circuits can be instantiated within different regions of each die. By including multiple test circuits, with each test circuit being located in a different region of each die, each of a plurality of different physical regions or zones of each die can be characterized individually in terms of one or more power metrics and one or more speed metrics. The data observed for each region of a die can be combined using a function, e.g., averaged, to yield a metric for power and a metric for speed, or can be maintained independently for purposes of characterizing each die.

In step 420, the interposers can be tested. The interposers can be tested for either one or both of power, e.g., static power dissipation, and/or speed, e.g., operating frequency. For example, passive interposers can be tested under a variety of different operating conditions to reflect maximum operating frequency. Active interposers can be tested under a variety of different operating conditions to reflect one or both of maximum static power dissipation and maximum operating frequency for each interposer.

In step 425, the system can receive the test data for the dies and for the interposers. In step 430, the system can calculate performance metrics from the test data. For example, the system can calculate the maximum static power dissipation for each die and, if applicable, for each interposer from the received test data. The system further can calculate the maximum operating frequency of each die and for each interposer. As noted, in one or more embodiments, when multiple test circuits are instantiated within each die, the test results obtained from each of the plurality of test circuits in a single die can be combined through a selected function to determine a single power metric and/or a single speed metric for the die. For example, test metrics for both speed and power can be determined, or reflect, a maximum across the entire die and/or an average across the entire die. In another example, a plurality of region-specific performance metrics can be calculated for each die.

In step 435, the system optionally can sort each die into one of a plurality of die groups and sort each interposer into one of a plurality of interposer groups. For example, the system can assign each die to one of a plurality of die groups based upon the performance metric(s) of that die. Similarly, the system can assign each interposer to one of a plurality of interposer groups based upon the performance metric(s) of that interposer.

For example, dies can be divided into "N" die groups, where N is an integer value greater than one. The N groups can be formed according to predetermined ranges for the particular performance metric that is being used to categorize the dies into die groups. In another example, dies can be divided into die groups by determining how closely the selected performance metric of a die is correlated to the selected performance metric of each other die. Those dies having a performance metric that is closely correlated, e.g., within a predetermined amount or percentage of one other, can be placed into the same group. When using correlation of performance metrics to determine groupings, the number of die groups that result from step 435 may not be predetermined, but rather ascertainable only after the correlation analysis is performed. For example, the number of groups can vary with how closely two dies to be located in the same die group must be correlated. It should be appreciated that any type of categorization or classification technique described to assign dies to die groups can be used to assign interposers to interposer groups.

As noted, dies can be grouped according to a power metric and a speed metric. In one or more embodiments, the system can determine one of a plurality of power die groups for each die based upon the power metric and one of a plurality of frequency die groups based upon the speed metric. The assignment of a die to a particular frequency die group can be independent of the assignment of that die to a particular power die group. This allows the system to select dies for implementing a multi-die IC when the performance specification for the multi-die IC specifies target operating frequency or target operating frequency range or, alternatively maximum static power dissipation.

In one or more other embodiments, power and speed metrics can be used in combination to assign dies to die groups. For example, an expression that depends upon both maximum static power dissipation (MSPD) and maximum operating frequency (MOF) can be specified. Dies can be assigned to die groups based upon predetermined ranges of the result of the expression or can be assigned to die groups based upon how closely correlated the result of the expression is for the die with respect to each other die.

One example of an expression that depends upon both maximum static power dissipation and maximum operating frequency can be "a(MSPD)+b(MOF)", wherein "a" is a constant used as a weighting factor for the term MSPD and "b" is a constant used as a weighting factor for the term MOF. The terms "a" and "b" can be used to set the relative importance and degree to which each of MSPD and MOF respectively influences the result of the expression. Other expressions can be used that account for the relative importance of each metric in determining which dies can be combined to comply with a selected performance specification.

In step 440, the system can select dies and/or interposers for inclusion within a same multi-die IC according to the performance metrics. In general, like or similar dies can be selected for inclusion within a same multi-die IC. An interposer having like or similar performance metrics as compared to the selected dies can be used to build the multi-die IC.

Dies can be determined to be like or similar by the system using a variety of different techniques. For example, the system can select dies from a same die group for inclusion within a same multi-die IC. In another example, when dies from a same die group are used to build the multi-die IC, the system can select those dies of the same die group having one or more performance metrics that are more highly correlated with one another, e.g., correlated within a predetermined range or measure of one another.

In another example, when multiple test circuits are instantiated within each die, the system can perform a region-by-region correlation analysis among dies in a same group. Again, those dies having a highest degree of correlation over each region can be selected for inclusion or use within the same multi-die IC. It should be appreciated that when no die groups are formed, the system can select dies for inclusion within a same multi-die IC based upon correlation of one or more metrics of each die. As noted, the correlation can be performed using a single metric for each die or across a plurality of different measurements or metrics, e.g., where dies are characterized using a plurality of test circuits across different regions of each die.

The interposer can be selected using a same or similar technique as the dies. For example, an interposer from an interposer group having the same or similar performance metrics as the die group from which dies are selected can be chosen for use in implementing the multi-die IC. In another example, an interposer having a performance metric that is highly correlated with the performance metric of the selected dies can be chosen for use in implementing the multi-die IC.

Figure 5:
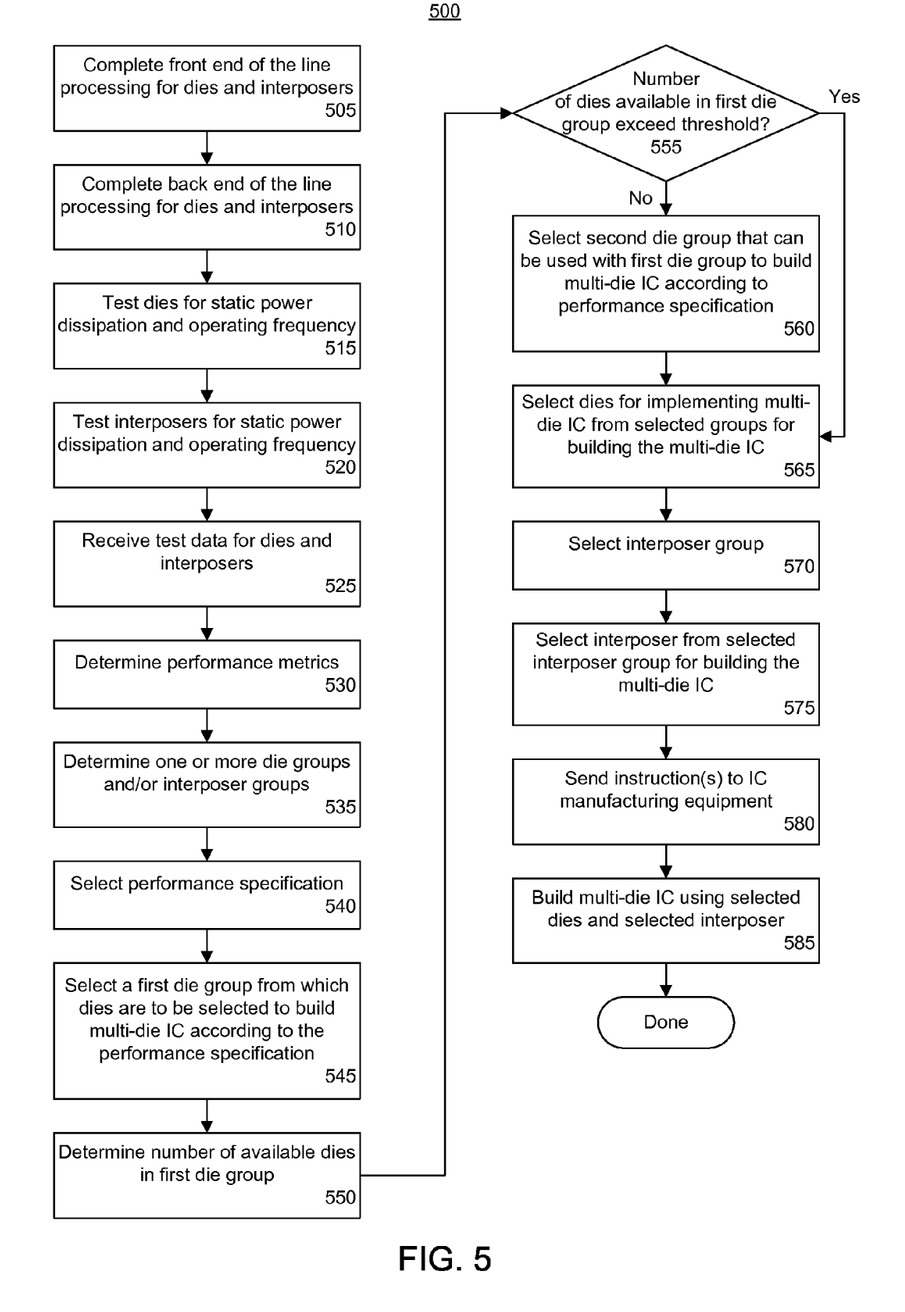
FIG. 5 is a second flow chart illustrating a method of reducing variation in a multi-die IC.

FIG. 5 is a second flow chart illustrating a method 500 of reducing variation in a multi-die IC in accordance with another embodiment. Method 500 can be performed by a system such as system 100 described with reference to FIG. 1. Method 500 can begin in a state where dies for a multi-die IC manufacturing process are being fabricated in addition to the interposer upon which the dies are to be disposed. The manufacturing process can be implemented to create or manufacture a multi-die IC as illustrated with reference to FIGS. 2 and 3, for example. The dies and the interposers can be in wafer form. It should be appreciated that while method 500 is described with reference to building a single multi-die IC, the process can be performed to build a plurality of multi-die ICs.

In step 505, front end of the line (FEOL) processing for the dies and the interposers can be performed. In step 510, back end of the line (BEOL) processing for the dies and the interposers can be performed. In step 515, the dies can be tested. The dies can be tested for static power dissipation and for operating frequency as described within this specification. In step 520, the interposers can be tested as described, e.g., for either one or both of power, e.g., static power dissipation, and/or speed, e.g., operating frequency.

In step 525, the system can receive the test data for the dies and for the interposers. In step 530, the system can calculate performance metrics from the test data. In step 535, the system can sort each die into one of a plurality of die groups and sort each interposer into one of a plurality of interposer groups.

In step 540, the system can select, or otherwise identify, a performance specification to which the multi-die IC being manufactured must conform. In step 545, the system can select a first die group from which dies are to be selected to build the multi-die IC in conformance with the selected performance specification. The first die group that is selected can be one in which the dies of the die group meet or exceed the requirement(s) specified by the performance specification, whether the requirements relate to maximum static power dissipation, maximum operating frequency, a combination of the two, or some other measure of quality.

Steps 550-560 illustrate one example of a technique for selecting and combining dies from different die groups to build a multi-die IC while still conforming to the performance specification selected in step 540. Steps 550-560, for example, can be used to aid in inventory control to regulate the number of dies kept on hand within different die groups.

In step 550, the system can determine the number of available dies in the first die group. In step 555, the system can determine whether the number of dies in the first die group is below a threshold number of dies. For example, when the number of dies available within the first die group does not exceed the threshold, the system can determine that dies of the first die group are in scarce supply. The threshold can be set or scaled according to the number of multi-die ICs to be built in compliance with the selected performance specification.

When the number of dies available in the first die group does not exceed the threshold, method 500 can continue to step 560. Accordingly, dies from more than one die group can be used to build the multi-die IC. When the number of dies available in the first die group does exceed the threshold, however, method 500 can proceed to step 565. In that case, only dies from the first die group are used to build the multi-die IC.

In step 560, the system can select a second die group that can be used in conjunction with the first die group to build the multi-die IC in accordance with the performance specification. When the number of available dies in the first die group does not exceed the threshold, a second die group having a performance metric that exceeds, or is superior to, the first die group can be selected. By selecting additional die groups that meet or exceed the requirements of the first die group, the multi-die IC built using a combination of dies from the first and second die groups is assured to meet or exceed the requirements of the performance specification.

For example, when the performance specification indicates maximum static power dissipation, a second die group can be selected that includes dies with a maximum static power dissipation less than the maximum static power dissipation required in the performance specification and the first die group. When the performance specification requires a particular operating frequency, a second die group can be selected that includes dies with a maximum operating frequency higher than the required operating frequency specified by the performance specification and the dies of the first die group. When the performance specification specifies a performance metric calculated using a selected expression as illustrated within this specification, a second die group that includes dies for which the result of the evaluated expression is superior than the value required by the performance specification and the first die group can be selected.

In one or more embodiments, when dies from a different die group are used to build the multi-die IC, the system can select those that are more correlated to be used within the same multi-die IC. For example, when selecting a first die from a slower frequency die group to be combined with a second die from a faster frequency die group, the second die from the faster frequency die group can be one of the slowest in that group, e.g., at a lower boundary for being included within the faster frequency die group. Accordingly, the second die that is selected is one that is considered to be more closely correlated to the first die in terms of the speed metric than another faster die within the faster frequency die group. A similar calculation and determination can be performed when considering power die groups.

Though not illustrated in FIG. 5, additional checks can be implemented to ensure that the number of dies within the second die group also exceeds a threshold number of dies. The threshold number of dies used for the second die group can be the same as or different and independent from the threshold described with reference to step 555.

In step 565, the system can select dies for building the multi-die IC from the selected die group or die groups, as the case may be. As noted, while dies can be selected from a same die group for implementing the multi-die IC, dies can be selected from two or more die groups. Accordingly, although only two die groups are illustrated in FIG. 5, it should be appreciated that dies can be selected from three or more die groups so long as the multi-die IC meets or exceeds the performance specification.

In step 570, an interposer group can be selected. When each interposer is classified into one of a plurality of interposer groups, a particular interposer group can be selected that meets or exceeds the requirement(s) of the performance specification. Additionally, in one or more embodiments, when the number of available interposers in an interposer group that meets the requirement of the performance specification is less than a threshold number of interposers, a different interposer group that has a performance metric or performance metrics superior to the selected interposer group can be selected. Additional checks can be imposed to ensure that the second interposer group has at least a threshold number of available interposers. The threshold number for the second interposer group can be the same as, or different and independent from, the threshold for the first interposer group.

In step 575, an interposer from the selected interposer group can be selected for use in creating the multi-die IC.

In step 580, the system can send instructions to the IC manufacturing equipment. For example, the instructions can indicate which dies and/or interposer that meet or exceed the selected performance specification are to be used to implement the multi-die IC. In step 585, the multi-die IC can be built using the selected dies and selected interposer.

For example, dicing can be performed with respect to die wafers and interposer wafers. Dies and interposers can be physically sorted into groups determined by the system using the wafer maps previously discussed. Dies can be pulled from the selected die group(s) and the interposer can be pulled from the selected interposer group. The selected dies can be bonded to the selected interposer. Further processing can be performed such as packaging the multi-die IC and the like.

FIG. 5 is provided for purposes of illustration only and is not intended to limit the one or more embodiments disclosed within this specification. For example, the selection of a second or alternate die or interposer group need not be performed. Alternatively, different group selection techniques can be used such as, for example, selecting the die group with the largest number of available dies that meets or exceeds the requirement(s) of the performance specification. Further, in one or more embodiments, interposer grouping and interposer group selection need not be performed. In that case, only dies can be characterized and grouped.

In another example, dies need not be grouped at all. In that case, the system can select the dies that are most highly correlated, or are correlated within an acceptable, e.g., predetermined, measure of one another for inclusion within the same multi-die IC as long as each individual die and/or interposer meets or exceeds the performance specification. Other examples of selecting dies for inclusion within a same multi-die IC can include selecting dies from a group that is determined to be faster than needed according to the specification and marking and/or selling the resulting multi-die IC as a less, e.g., a slower, multi-die IC.

Figure 6:
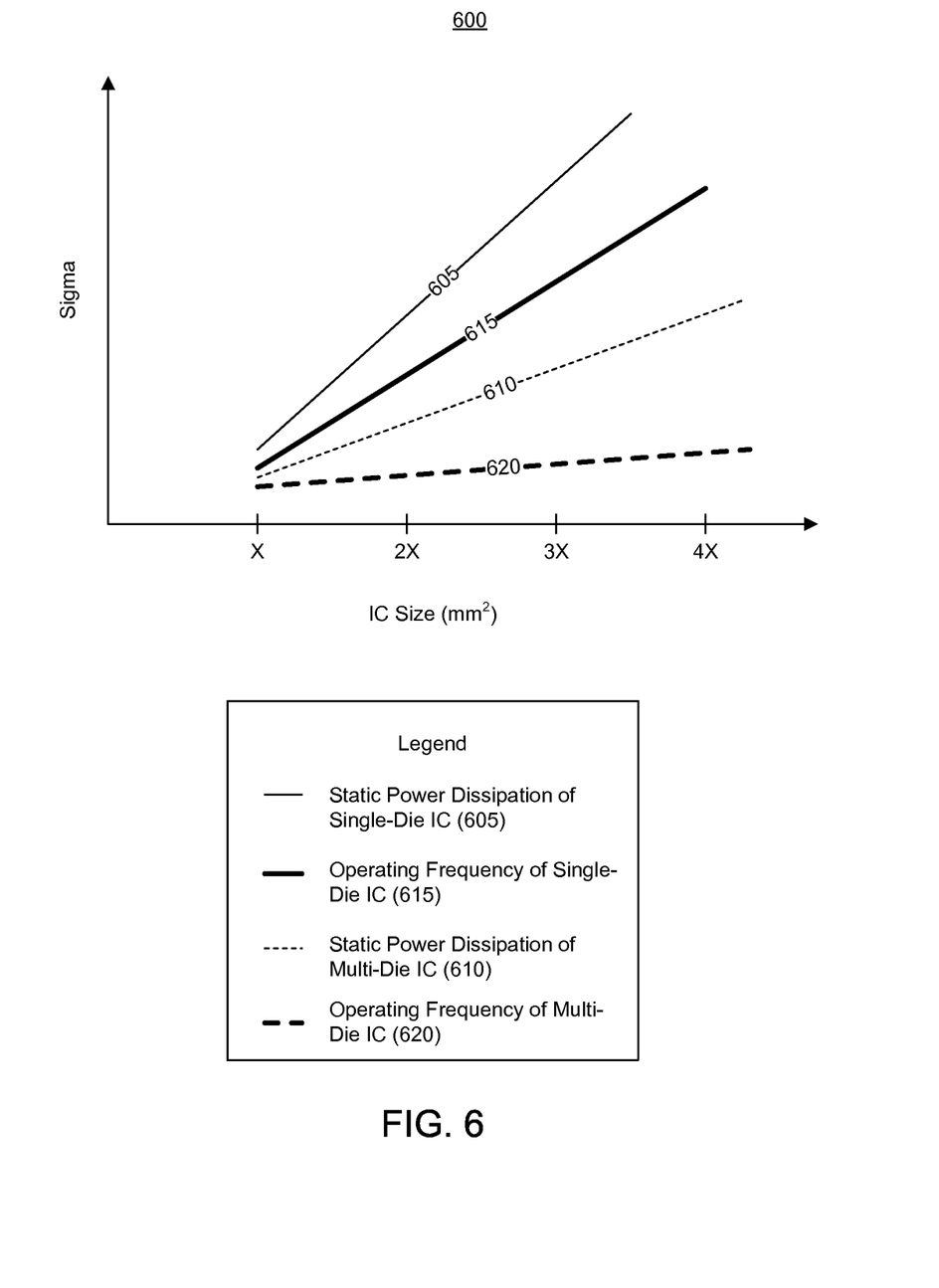
FIG. 6 is a first graph illustrating variation in selected performance metrics of different types of ICs versus IC size.

FIG. 6 is a first graph 600 illustrating variation in selected performance metrics of different types of ICs versus IC size in accordance with another embodiment. As used with reference to FIG. 6, the phrase "IC size", whether referring to an IC formed of a single, monolithic die or a plurality of smaller dies, i.e., a multi-die IC, refers to the total area of the IC. Thus, for a multi-die IC, the area of each constituent die can be summed to provide the total area. IC size is represented in graph 600 by the horizontal axis in units of square millimeters, where the factor "X" can represent a selected baseline number of square millimeters. Variation in a selected performance metric can be represented by the vertical axis in terms of Sigma, e.g., standard deviations.

As shown, line 605 is formed by plotting variation in maximum static power dissipation versus IC size for single-die ICs. Line 605 has a positive slope indicating that variation in maximum static power dissipation increases with IC size. Line 605 has a slope that is greater than the positive slope of line 610. Line 610 is formed by plotting variation in maximum static power dissipation versus IC size for a multi-die IC. As shown, variation in maximum static power dissipation for a multi-die IC increases as IC area increases, though at a lower rate than for a single-die IC. Thus, in general, the variation in maximum static power dissipation for a single-die IC is larger than for a multi-die IC of the same size.

Line 615 is formed by graphing variation in maximum operating frequency versus IC size for single-die ICs. Line 615 has a positive slope indicating that variation in maximum operating frequency increases with IC size. Line 615 has a slope that is greater than the slope of line 620. Line 620 is formed by plotting variation in maximum operating frequency versus IC size for a multi-die IC. Line 620, as shown, has a positive slope that is less than line 615. As shown, variation in maximum operating frequency for a multi-die IC generally increases, though at a lower rate than for a single-die IC. Thus, in general, the variation in maximum operating frequency for a single-die IC is larger than for a multi-die IC of the same size.

Figure 7:
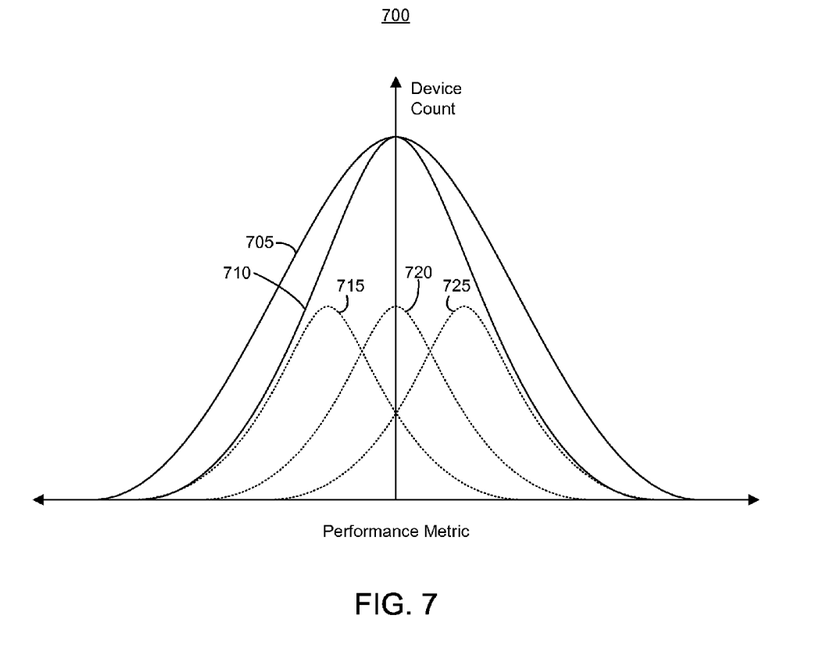
FIG. 7 is a second graph illustrating variation in IC performance metrics versus device count of ICs produced.

FIG. 7 is a second graph 700 illustrating variation in IC performance metrics versus device count of ICs produced in accordance with another embodiment. Within graph 700, the vertical axis represents device count, e.g., number of gates on an IC. Within FIG. 7, device count can serve as a proxy for IC size. The horizontal axis represents a selected performance metric such as maximum operating frequency or maximum static power dissipation.

Curve 705 is formed by plotting device count against the selected performance metric for a monolithic, single-die IC. Curve 710 is formed by plotting device count against the same performance metric used for curve 705. Curve 710, however, represents the variation in the selected performance metric for a multi-die IC formed from three dies that, when taken collectively, reach the same device counts as shown by curve 705. As shown, variation in the selected performance metric for the multi-die IC is less than the variation in the selected performance metric for the single-die IC. This reduced variation in the selected performance metric for the multi-die IC is demonstrated by the narrower width of curve 710 compared to curve 705.

Curves 715, 720, and 725 illustrate the variation in the selected performance metric of the individual dies used to create the multi-die IC represented by curve 710 as a function of device count. As noted, graph 700 presumes that three dies are used to implement the multi-die IC. Variation in the selected performance metric as a function of device count for the first die used to build the multi-die IC is reflected in curve 715. Variation in the selected performance metric as a function of device count for the second die used to build the multi-die IC is reflected in curve 720. Variation in the selected performance metric as a function of device count for the third die used to build the multi-die IC is reflected in curve 725. Curves 715-725 illustrate that while differences exist in the distribution of the performance metric of the three dies as a function of device count, the resulting multi-die IC can have less variation in the performance metric when compared to a single-die IC for the same device counts.

The one or more embodiments disclosed within this specification illustrate how to manufacture a multi-die IC with reduced variation in terms of one or more selected performance metrics. By characterizing dies and/or interposers in terms of one or more performance metrics, dies and/or an interposer with like performance metrics can be selected to build a multi-die IC. The dies and/or interposer can be selected according, at least in part, to a performance specification to which the resulting multi-die IC is to adhere. Variation in the resulting multi-die IC, when applying the one or more embodiments disclosed herein, can be less than a single-die IC of the same area.

The flowchart in the figures illustrates the architecture, functionality, and operation of possible implementations of systems, methods and computer program products according to various embodiments. In this regard, each block in the flowchart may represent a module, segment, or portion of code, which comprises one or more portions of executable program code that implements the specified logical function(s).

It should be noted that, in some alternative implementations, the functions noted in the blocks may occur out of the order noted in the figure. For example, two blocks shown in succession may, in fact, be executed substantially concurrently, or the blocks may sometimes be executed in the reverse order, depending upon the functionality involved. It also should be noted that each block of the flowchart illustration, and combinations of blocks in the flowchart illustration, can be implemented by special purpose hardware-based systems, e.g., IC manufacturing and/or test equipment, that perform the specified functions or acts, or combinations of special purpose hardware and executable instructions.

One or more embodiments of the present invention can be realized in hardware or a combination of hardware and software. One or more embodiments can be realized in a centralized fashion in one system or in a distributed fashion where different elements are spread across several interconnected systems. Any kind of data processing system or other apparatus adapted for carrying out the methods described herein is suited.

One or more embodiments of the present invention further can be embedded in a device such as a computer program product, which comprises all the features enabling the implementation of the methods described herein. The device can include a data storage medium, e.g., a computer-usable or computer-readable medium, storing program code that, when loaded and executed in a system comprising memory and a processor, causes the system to perform the functions described herein. Examples of data storage media can include, but are not limited to, optical media, magnetic media, magneto-optical media, computer memory such as random access memory or hard disk(s), or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed herein can be embodied in other forms without departing from the spirit or essential attributes thereof. Accordingly, reference should be made to the following claims, rather than to the foregoing specification, as indicating the scope of the one or more embodiments of the present invention.

What is claimed is:

1. A method of reducing variation in multi-die integrated circuits, the method comprising:
    testing each of a plurality of dies in wafer form during manufacturing for at least one of static power dissipation or operating frequency resulting in test data stored in a memory;
    for each of the plurality of dies, determining at least one performance metric from the test data using a processor;
    sorting each of the plurality of dies into one of a plurality of die groups according to the at least one performance metric of each die; and
    selecting, via the processor, at least two dies for inclusion within a multi-die integrated circuit according to the at least one performance metric;
    wherein selecting at least two dies comprises selecting at least two dies from at least one of the plurality of die groups.

2. The method of claim 1, wherein selecting at least two dies further comprises:
    selecting only dies for inclusion within the multi-die integrated circuit from a same die group.

3. The method of claim 1, wherein selecting at least two dies further comprises:
    selecting a first die from a first die group of the plurality of die groups and at least a second die from at least a second die group of the plurality of die groups for inclusion within the multi-die integrated circuit.

4. The method of claim 1, wherein selecting at least two dies comprises:
    selecting the at least two dies according to a measure of correlation between the at least one performance metric of each die.

5. The method of claim 1, further comprising:
    for each of a plurality of interposers, determining at least one performance metric; and
    selecting an interposer according to the at least one performance metric of the interposer for inclusion within the multi-die integrated circuit with the selected dies;
    wherein the selected dies are coupled to the interposer using a plurality of micro bumps.

6. The method of claim 1, wherein the performance metric depends upon both static power dissipation and operating frequency.

7. The method of claim 1, wherein:
    the performance metric is determined for each of a plurality of different regions in each die; and
    the dies are sorted into the groups according to correlation between regions of different dies performed on a region-by-region basis.

8. The method of claim 1, wherein the performance metric for each die is determined from test circuits implemented in different regions of the die.

9. The method of claim 1, wherein:
    the dies are programmable integrated circuit dies; and
    the performance metrics are determined by implementing test circuits within the programmable integrated circuit dies and observing at least one of static power dissipation or operating frequency for the test circuits.

10. The method of claim 3, further comprising:
    selecting the at least a second die group to be a die group comprising dies with a performance metric superior to the dies of the first die group.

11. A system for reducing variation in multi-die integrated circuits, the system comprising:
    a memory storing program code; and
    a processor coupled to the memory, wherein the processor, responsive to executing the program code, is configured to initiate steps comprising:
        testing each of a plurality of dies in wafer form during manufacturing for at least one of static power dissipation or operating frequency resulting in test data stored in a memory;
        for each of the plurality of dies, determining at least one performance metric from the test data;
        sorting each of the plurality of dies into one of a plurality of die groups according to the at least one performance metric of each die; and
        selecting at least two dies for inclusion within a multi-die integrated circuit according to the at least one performance metric;
        wherein selecting at least two dies comprises selecting at least two dies from at least one of the plurality of groups.

12. The system of claim 11, wherein selecting at least two dies further comprises:
    selecting only dies for inclusion within the multi-die integrated circuit from a same die group.

13. The system of claim 11, wherein selecting at least two dies further comprises:

selecting a first die from a first die group of the plurality of die groups and at least a second die from at least a second die group of the plurality of die groups for inclusion within the multi-die integrated circuit.

14. The system of claim 11, wherein selecting at least two dies comprises:
selecting the at least two dies according to a measure of correlation between the at least one performance metric of each die.

15. The system of claim 11, wherein the processor is further configured to perform a plurality of steps comprising:
for each of a plurality of interposers, determining at least one performance metric; and
selecting an interposer according to the at least one performance metric of the interposer for inclusion within the multi-die integrated circuit with the selected dies;
wherein the selected dies are coupled to the interposer using a plurality of micro bumps.

16. A device, comprising:
a non-transitory data storage medium usable by a system comprising a processor and a memory, wherein the non-transitory data storage medium stores program code that, when executed by the system, configures the system to perform a method of reducing variation in multi-die integrated circuits, the method comprising:
testing each of a plurality of dies in wafer form during manufacturing for at least one of static power dissipation or operating frequency resulting in test data stored in a memory;
for each of the plurality of dies, determining at least one performance metric from the test data;
sorting each of the plurality of dies into one of a plurality of die groups according to the at least one performance metric of each die; and
selecting at least two dies for inclusion within a multi-die integrated circuit according to the at least one performance metric;
wherein selecting at least two dies comprises selecting at least two dies from at least one of the plurality of die groups.

17. The device of claim 16, wherein selecting at least two dies further comprises:
selecting only dies for inclusion within the multi-die integrated circuit from a same die group.

18. The device of claim 16, wherein selecting at least two dies further comprises:
selecting a first die from a first die group of the plurality of die groups and at least a second die from at least a second die group of the plurality of die groups for inclusion within the multi-die integrated circuit.

19. The device of claim 16, wherein the non-transitory data storage medium stores further program code that, when executed by the system, configures the system to perform steps comprising:
for each of a plurality of interposers, determining at least one performance metric; and
selecting an interposer according to the at least one performance metric of the interposer for inclusion within the multi-die integrated circuit with the selected dies;
wherein the selected dies are coupled to the interposer using a plurality of micro bumps.

* * * * *